US009947386B2

(12) United States Patent
Arora et al.

(10) Patent No.: US 9,947,386 B2
(45) Date of Patent: Apr. 17, 2018

(54) THERMAL AWARE DATA PLACEMENT AND COMPUTE DISPATCH IN A MEMORY SYSTEM

(71) Applicant: Advanced Micro Devices, Inc., Sunnyvale, CA (US)

(72) Inventors: Manish Arora, Dublin, CA (US); Indrani Paul, Round Rock, TX (US); Yasuko Eckert, Redmond, WA (US); Nuwan Jayasena, Sunnyvale, CA (US); Dong Ping Zhang, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 45 days.

(21) Appl. No.: 14/492,045

(22) Filed: Sep. 21, 2014

(65) Prior Publication Data
US 2016/0086654 A1  Mar. 24, 2016

(51) Int. Cl.
G11C 11/4078 (2006.01)
G11C 11/4096 (2006.01)
G11C 5/02 (2006.01)
G11C 7/04 (2006.01)
G11C 8/12 (2006.01)

(52) U.S. Cl.
CPC .......... G11C 11/4096 (2013.01); G11C 5/025 (2013.01); G11C 7/04 (2013.01); G11C 8/12 (2013.01)

(58) Field of Classification Search
CPC ...... G06F 3/067; G06F 3/0605; G06F 3/0659; G06F 1/206; G06F 3/0613; G06F 3/0688; G06F 3/0653
See application file for complete search history.

(56) References Cited

U.S. PATENT DOCUMENTS

| | | | | |
|---|---|---|---|---|
| 5,678,021 A * | 10/1997 | Pawate | ............... | G06F 15/7821 711/104 |
| 5,978,335 A * | 11/1999 | Clark | ................... | G11B 7/0045 369/53.34 |
| 6,137,644 A * | 10/2000 | Hetzler | .............. | G11B 20/1258 360/48 |
| 6,324,620 B1 * | 11/2001 | Christenson | ............ | G06F 3/061 710/74 |
| 6,356,988 B1 * | 3/2002 | Takizawa | ............ | G06F 12/0215 345/564 |

(Continued)

OTHER PUBLICATIONS

Park, Seonyeong, A Comprehensive Study of Energy Efficiency and Performace of Flash-based SSD, Feb. 25, 2011, Journal of Systems Architecture vol. 57 2011, 354-365.*

(Continued)

*Primary Examiner* — Midys Rojas
*Assistant Examiner* — Khoa D Doan
(74) *Attorney, Agent, or Firm* — Liang & Cheng, PC (57) ABSTRACT

A method of managing thermal levels in a memory system may include determining an expected thermal level associated with each of a plurality of locations in a memory structure, and for each operation of a plurality of operations addressed to the memory structure, assigning the operation to a target location of the plurality of physical locations in the memory structure based on a thermal penalty associated with the operation and the expected thermal level associated with the target location.

20 Claims, 4 Drawing Sheets

(56) References Cited

U.S. PATENT DOCUMENTS

| | | | | |
|---|---|---|---|---|
| 6,430,098 B1* | 8/2002 | Afghahi | G11C 11/405 | 365/187 |
| 6,778,457 B1* | 8/2004 | Burgan | G11C 11/406 | 365/201 |
| 6,804,160 B2* | 10/2004 | Schafer | G11C 5/14 | 365/200 |
| 7,324,299 B1* | 1/2008 | Schreck | G11B 5/58 | 360/75 |
| 7,428,644 B2* | 9/2008 | Jeddeloh | G06F 1/206 | 713/300 |
| 7,877,751 B2* | 1/2011 | Maeda | G06F 1/206 | 713/300 |
| 8,151,037 B1* | 4/2012 | Zhou | G06F 12/0246 | 711/103 |
| 8,438,358 B1* | 5/2013 | Kraipak | G11C 7/04 | 327/512 |
| 8,706,966 B1* | 4/2014 | Kraipak | G11C 7/20 | 711/118 |
| 8,788,779 B1* | 7/2014 | Horn | G06F 3/0616 | 711/103 |
| 8,930,647 B1* | 1/2015 | Smith | G06F 9/44557 | 711/103 |
| 9,268,499 B1* | 2/2016 | Wilkins | G06F 3/068 | |
| 2003/0018868 A1* | 1/2003 | Chung | G06F 9/3879 | 711/168 |
| 2003/0179631 A1* | 9/2003 | Koob | H03K 17/693 | 365/200 |
| 2005/0081009 A1* | 4/2005 | Williams | G06F 3/061 | 711/163 |
| 2006/0010290 A1* | 1/2006 | Sasamoto | G06F 3/0605 | 711/114 |
| 2006/0092801 A1* | 5/2006 | Van Der Kall | G11B 19/02 | 369/53.43 |
| 2007/0180186 A1* | 8/2007 | Cornwell | G06F 12/023 | 711/103 |
| 2007/0294552 A1* | 12/2007 | Kakihara | G06F 1/3221 | 713/320 |
| 2008/0016297 A1* | 1/2008 | Bartley | G06F 12/08 | 711/159 |
| 2008/0142860 A1* | 6/2008 | Chen | H01L 23/5223 | 257/296 |
| 2008/0270691 A1* | 10/2008 | Belady | G06F 1/20 | 711/114 |
| 2008/0298186 A1* | 12/2008 | Escobar-Bowser | G11B 19/00 | 369/47.5 |
| 2009/0077558 A1* | 3/2009 | Arakawa | G06F 1/206 | 718/102 |
| 2009/0225461 A1* | 9/2009 | Aoki | G11B 5/012 | 360/31 |
| 2010/0169585 A1* | 7/2010 | Steinbrecher | G11C 7/04 | 711/154 |
| 2011/0283046 A1* | 11/2011 | Koseki | G06F 3/061 | 711/103 |
| 2012/0066439 A1* | 3/2012 | Fillingim | G06F 11/3485 | 711/103 |
| 2013/0080680 A1* | 3/2013 | Chu | G06F 12/0246 | 711/102 |
| 2013/0159597 A1* | 6/2013 | Cheong | G06F 12/0638 | 711/102 |
| 2013/0238851 A1* | 9/2013 | Chang | G06F 3/061 | 711/113 |
| 2013/0275665 A1* | 10/2013 | Saraswat | G11C 7/04 | 711/106 |
| 2013/0305067 A1* | 11/2013 | Lefurgy | G06F 9/4893 | 713/320 |
| 2014/0025855 A1* | 1/2014 | Fujita | G06F 13/161 | 710/118 |
| 2014/0115281 A1* | 4/2014 | Coteus | G06F 1/20 | 711/154 |
| 2014/0160531 A1* | 6/2014 | Mima | H04N 1/00978 | 358/1.16 |
| 2014/0208041 A1* | 7/2014 | Hyde | G06F 12/0831 | 711/146 |
| 2014/0281311 A1* | 9/2014 | Walker | G06F 3/0631 | 711/162 |
| 2014/0297947 A1* | 10/2014 | Tamura | G06F 3/061 | 711/114 |
| 2014/0298061 A1* | 10/2014 | Volvovski | G06F 3/0625 | 713/323 |
| 2014/0359241 A1* | 12/2014 | Dell | G06F 12/02 | 711/165 |
| 2014/0372698 A1* | 12/2014 | Lee | G06F 3/06 | 711/114 |
| 2014/0380329 A1* | 12/2014 | Arora | G06F 9/5094 | 718/104 |
| 2015/0143037 A1* | 5/2015 | Smith | G06F 3/061 | 711/103 |
| 2015/0227391 A1* | 8/2015 | Paul | G06F 9/5094 | 718/102 |
| 2016/0062676 A1* | 3/2016 | Campbell | G06F 3/0616 | 711/103 |
| 2016/0080490 A1* | 3/2016 | Verma | H04L 67/1097 | 709/217 |
| 2016/0085458 A1* | 3/2016 | Skandakumaran | G06F 3/0613 | 710/313 |

OTHER PUBLICATIONS

Lin, J., Zheng, H., Zhu, Z., David, H., & Zhang, Z. (2007). Thermal modeling and management of DRAM memory systems (vol. 35, No. 2, pp. 312-322). ACM.

Mittal, S. (2012). A survey of architectural techniques for DRAM power management. International Journal of High Performance Systems Architecture, 4(2), 110-119.

Zhang, D., Jayasena, N., Lyashevsky, A., Greathouse, J. L., Xu, L., & Ignatowski, M. (Jun. 2014). TOP-PIM: throughput-oriented programmable processing in memory. In Proceedings of the 23rd international symposium on High-performance parallel and distributed computing (pp. 85-98). ACM.

* cited by examiner

THERMAL AWARE DATA PLACEMENT AND COMPUTE DISPATCH IN A MEMORY SYSTEM

GOVERNMENT RIGHTS

This invention was made with Government support under Prime Contract Number DE-AC52-07NA27344, Subcontract Number B600716 awarded by DOE. The Government has certain rights in this invention.

TECHNICAL FIELD

This disclosure relates to the field of memory management and, in particular, to placement of data and processing tasks in a memory system.

BACKGROUND

Modern computing systems commonly rely on random access memory (RAM) for relatively short term data storage. In particular, dynamic random access memory (DRAM) is a type of RAM implemented in integrated circuitry that stores bit values in charged and discharged capacitors. As high-performance DRAM is used with increasing speed and power density, thermal management of DRAM systems has become increasingly important.

Methods for thermal management of DRAM systems may include memory and/or processor throttling or dynamic voltage and frequency scaling (DVFS). These approaches, however, may not lower the peak temperature of the memory system in a timely manner, may cause system-wide under-utilization, and may also result in performance degradations. Alternatively, more aggressive cooling solutions may be integrated to remove heat from the memory system; however, the implementation of such cooling solutions may increase the cost of manufacturing or packaging, and may increase the size of the memory system.

Additionally, some memory systems, known as "processor in memory" (PIM) systems, may include processing logic that is in close proximity with the memory cells in the system. Heat generated by processing operations further complicates the problem of thermal management of the PIM system.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the spirit and scope of the embodiments.

Embodiments of a processor-in-memory (PIM) system may include one or more nodes, with each node including single or multiple memory stacks, and with each memory stack including one or more memory dies stacked on top of a logic die. PIM systems may vary widely in topology, and unmanaged placement of data in the memory and dispatch of processing tasks to be executed by the logic dies may result in uneven heat distribution, with thermal hot spots at some locations in the PIM system while other locations within the PIM system operate at lower temperatures. The thermal hot spots can decrease the overall resilience and reliability of the entire system, degrade the performance, and increase power consumption due to thermal throttling and coupling, transistor leakage and increased refresh rate of the memory devices. In one embodiment, control logic for a PIM system manages the thermal imbalances by determining an expected thermal level associated with each of multiple locations in the system, then assigning operations to target locations that are selected based on the expected thermal levels of the target locations and an expected thermal penalty of the operation.

For instance, one type of operation is a memory write operation for storing data in the memory structure of the PIM system; thus, the control logic calculates a thermal penalty associated with the data based on an expected access pattern of the data. For example, data that is accessed more frequently may have a higher thermal penalty than data that is accessed infrequently. The control logic selects a target location in the memory in which to store the data based on the expected thermal level for the target location. For example, the control logic may select a location in the memory that is physically near a cooling component or far from a heat source and therefore has a lower expected thermal level than a location that is far from a cooling component or near a heat source. The control logic may accordingly select such a target location having a low expected thermal level for storing frequently accessed data that is associated with a high thermal penalty, and may select a target location having a high expected thermal level for storing data that is associated with a low thermal penalty.

Another type of operation is a processing task for executing in one of the logic dies in the memory structure. A processing task may include one or more computations to be performed by the logic die. For such a processing task, the associated thermal penalty may result from heat generated by the logic die executing the processing task. Accordingly, the control logic may assign a processing task having a high expected thermal penalty to a location (e.g., a logic die) in the memory structure having a low expected thermal level. In one embodiment, the processing task may be assigned to a location that is a minimum distance away from another logic die that is executing a concurrent processing task, or a minimum distance away from a memory location storing data that will be accessed concurrently with execution of the processing task. For example, a processing task that is expected to access memory in a first memory stack may be dispatched for execution in the logic die of a second memory stack to avoid generating excess heat in the first memory stack. By managing the placement of data and processing tasks, thermal management of the PIM system can reduce dependence on voltage and frequency throttling and increase system reliability and performance.

Figure 1:
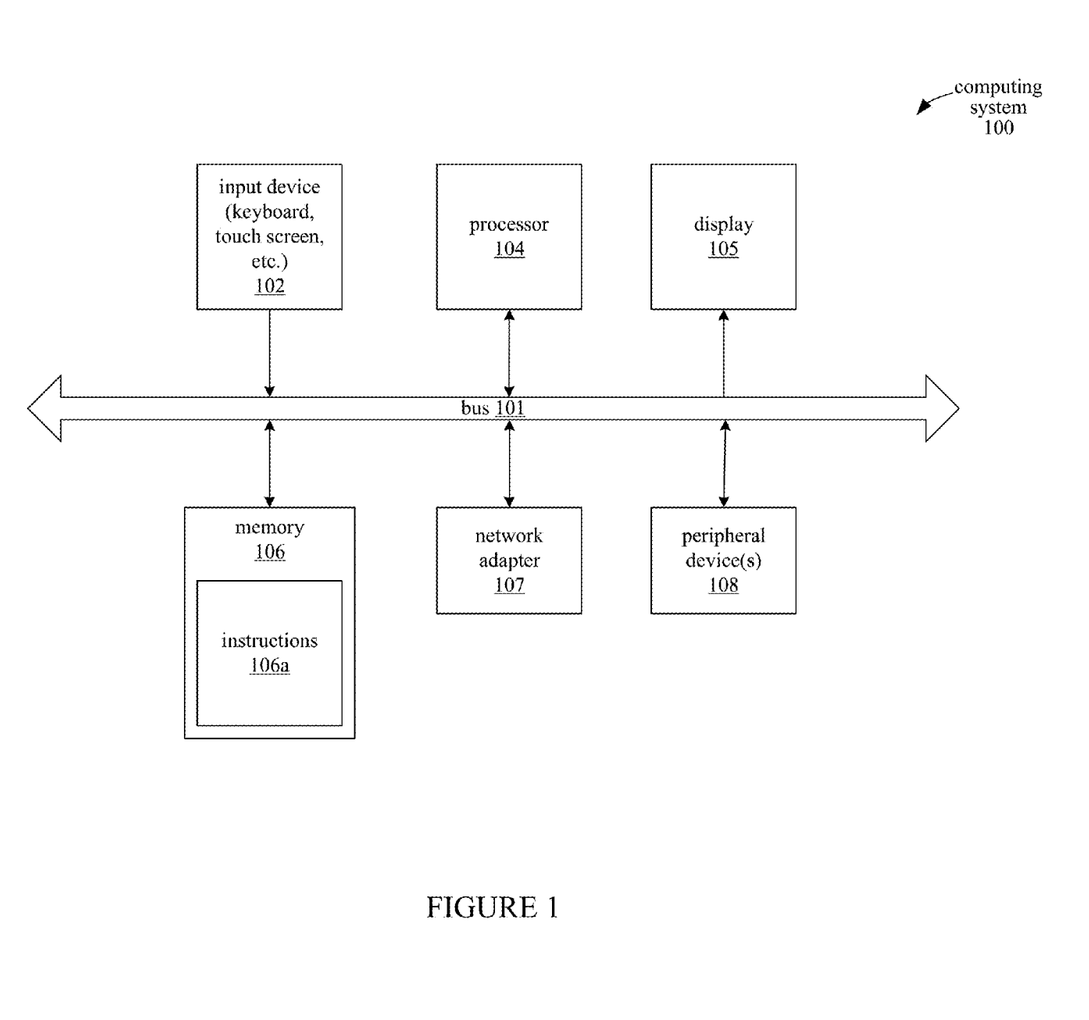
FIG. 1 illustrates an embodiment of a computing system.

FIG. 1 illustrates an embodiment of a computing system 100 which may implement a thermal aware data placement and compute dispatch scheme as described above. In general, the computing system 100 may be embodied as any of a number of different types of devices, including but not limited to a laptop or desktop computer, mobile phone, server, etc. The computing system 100 includes a number of components 102-108 that can communicate with each other through a bus 101. In computing system 100, each of the components 102-108 is capable of communicating with any of the other components 102-108 either directly through the bus 101, or via one or more of the other components 102-108. The components 101-108 in computing system 100 are contained within a single physical casing, such as a laptop or desktop chassis, or a mobile phone casing. In alternative embodiments, some of the components of computing system 100 may be embodied as peripheral devices such that the entire computing system 100 does not reside within a single physical casing.

Computing system 100 includes a processor 104 that is configured to receive and execute instructions 106a that are stored in the memory subsystem 106. In alternative embodiments, the computing system does not include a processor 104; for example, computations in the system may be carried out in logic dies integrated with the memory, or in logic residing elsewhere in the system. Memory subsystem 106 includes memory devices used by the computing system 100, such as random-access memory (RAM) modules, read-only memory (ROM) modules, hard disks, and other non-transitory computer-readable media. In one embodiment, the memory subsystem 106 may include a memory controller or other control logic that performs the operations for implementing thermal aware data placement and compute dispatch scheme. Alternatively, the instructions 106a may direct the processor 104 to perform these operations.

The computing system 100 also includes user interface devices for receiving information from or providing information to a user. Specifically, the computing system 100 includes an input device 102, such as a keyboard, mouse, touch-screen, or other device for receiving information from the user. The computing system 100 displays information to the user via a display 105, such as a monitor, light-emitting diode (LED) display, liquid crystal display, or other output device.

Computing system 100 additionally includes a network adapter 107 for transmitting and receiving data over a wired or wireless network. Computing system 100 also includes one or more peripheral devices 108. The peripheral devices 108 may include mass storage devices, location detection devices, sensors, input devices, or other types of devices that can be used by the computing system 100.

Figure 2A:
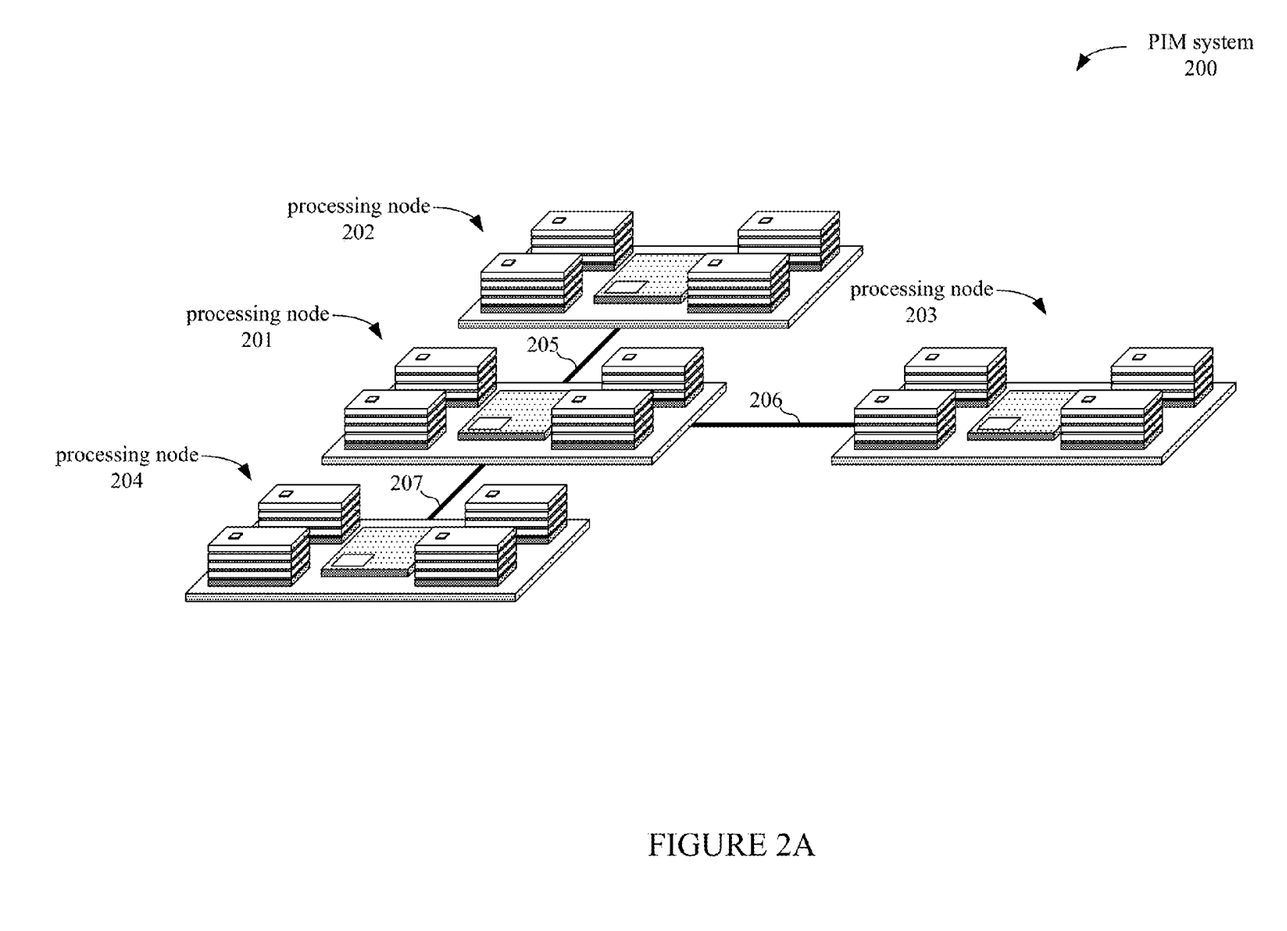
FIG. 2A illustrates an embodiment of memory structure.

FIG. 2A illustrates an embodiment of a PIM system 200, which may be implemented as part of memory subsystem 106. PIM system 200 includes multiple processing nodes 201, 202, 203, and 204 that are connected together by bus lines 205, 206, and 207. Thus, each of the processing nodes 201-204 can communicate with each of the other nodes 201-204. In one embodiment, some or all of the nodes 201-204 are substantially identical to each other; alternatively, the nodes 201-204 may differ in structure, size, memory capacity, processing power, etc. System 200, as illustrated in FIG. 2A, has a topology wherein node 201 is connected to each of the nodes 202-204. As previously stated, PIM systems may vary widely in topology and number of nodes; accordingly, alternative embodiments may include fewer or more nodes that are connected in a variety of other possible arrangements.

Figure 2B:
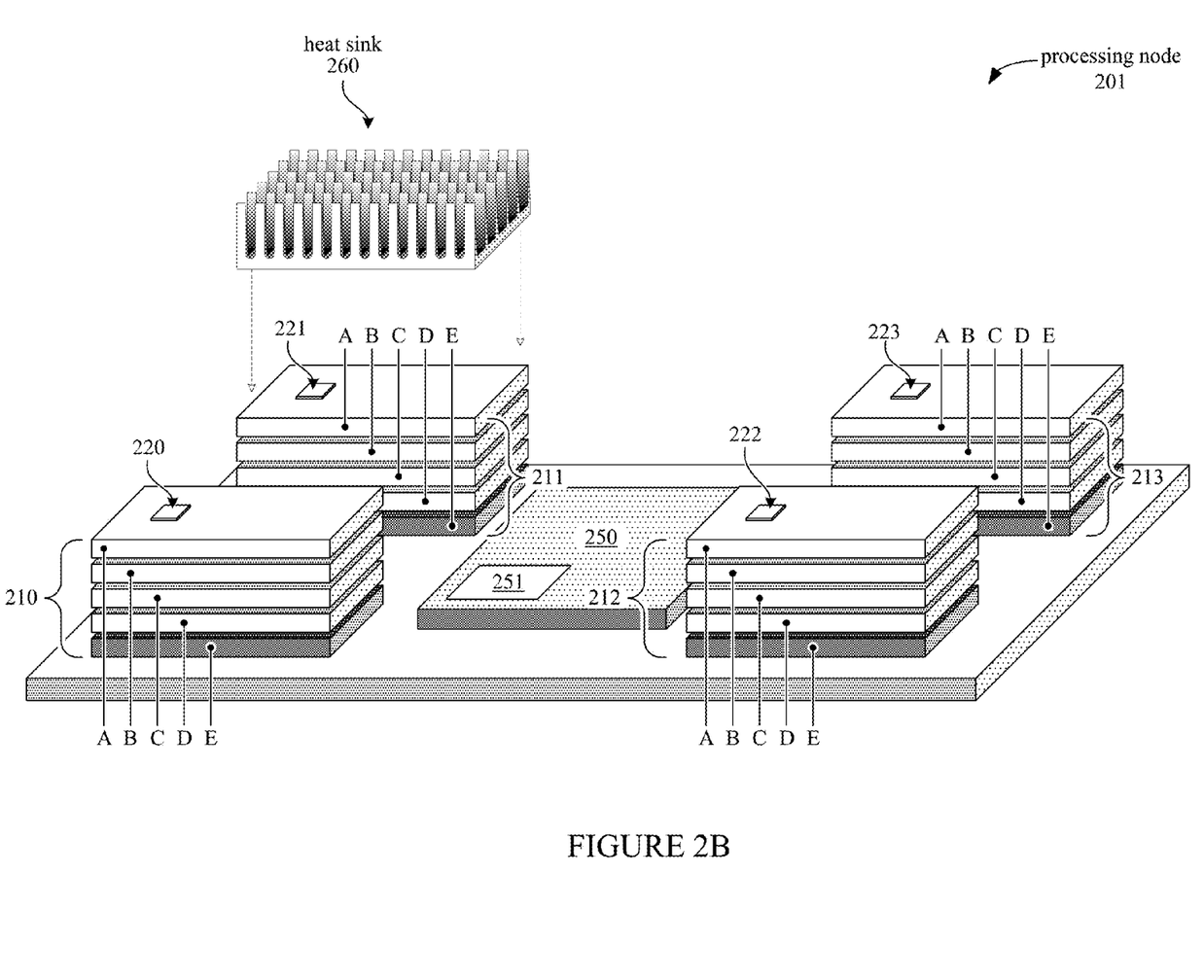
FIG. 2B illustrates an embodiment of memory structure.

FIG. 2B illustrates an embodiment of a processing node 201 of a PIM system 200. Node 201 includes a host processor 250 that is mounted on a substrate with a memory structure of the PIM system. The memory structure of the PIM system includes memory dies arranged in multiple memory stacks 210, 211, 212, and 213. Each of the memory stacks 210-213 comprises stacked dies A, B, C, D, and E. As referenced herein, individual dies are identified by the reference characters of their respective memory stacks, followed by the letter A, B, C, D, or E identifying the position of the die within the stack. For example, dies 210E, 211E, 212E, and 213E are logic dies located at the bottoms of the memory stacks 210, 211, 212, and 213, respectively. The A, B, C, and D dies in each of the stacks 210-213 are memory dies.

The integration of processors or other computing logic in the logic dies 210E, 211E, 212E, and 213E within the memory stacks 210-213 enables PIM capabilities within each memory stack. In each of the stacks 210-213, the memory dies A-D are vertically stacked on top of the logic die E using three-dimensional (3D) die stacking technology and connected by through-silicon-vias (TSVs). This arrangement offers high bandwidth, low latency memory accesses from the processors or other logic implemented in the in-stack logic dies E. In alternative embodiments, the logic die may be positioned on top or in between the memory dies in the stack; for example, the logic die E may be positioned on top of the memory dies A-D instead of underneath the memory dies A-D. In alternative embodiments, techniques other than TSVs may be employed for connecting the stacked dies.

However, the integration of logic dies within the memory stacks may lead to strong interactions between the computational components of the logic dies and the memory. In particular, memory temperature may be affected by heat generated as a result of processing performed in the logic dies. Furthermore, 3D stacking of memory dies can result in higher power density and less efficient heat dissipation, as compared to memory that is not stacked. Higher peak temperatures in the 3D memory stacks may adversely impact system reliability and performance.

Uneven thermal distribution in a PIM system 200 including 3D stacked nodes, such as node 201, can be managed using a thermal-aware data placement and compute dispatch scheme. Control logic for a node 201 that implements such a scheme may model or dynamically monitor the thermal levels of multiple locations in the memory stacks 210-213, then assign pending operations to locations in the memory stacks based on the expected thermal level at those locations and the expected thermal penalties that will be incurred by the operations. Operations that may be managed by the scheme may include, for example, memory write operations for storing data in one of the memory dies A-D, or processing tasks to be executed in one or more of the logic dies E.

In one embodiment, a memory controller 251, implemented in the host processor 250, includes control logic for performing thermal management of the memory via the data placement and compute dispatch scheme. The memory controller 251 may also be used to control the memory in each of the stacks 210-213; for example, the memory controller 251 may issue read, write, erase, refresh, and various other commands to the memory. In some embodiments, each of the logic dies E may also include logic for controlling the memory within their respective stacks. In alternative embodiments, memory controller functions may be implemented in the logic dies E instead of the host processor 250, or may be implemented in another module separate from processing node 201.

In addition to the read, write, refresh, and other commands, the memory controller 251 also performs thermal management of the memory by determining the placement of operations such as memory writes and processing tasks among the available physical locations in processing node 201. The memory controller 251 determines an expected thermal level associated with each of a number of physical locations in the node 201. In one embodiment, each of these physical locations may correspond to a specific die or a region within a die. Then, for each operation of a number of pending operations destined for placement in the node 201, the memory controller 251 assigns the operation to a target location based on a thermal penalty associated with the operation and the expected thermal level for the target location.

In one embodiment, the types of operations that can be placed by the memory controller 251 include at least memory writes for storing data in one of the memory dies A-D and processing tasks for executing in one of the logic dies E. The memory controller 251 may additionally manage the placement of other types of operations that can be assigned to particular locations in the node 201 and that can cause thermal penalties to be incurred at those locations.

In one embodiment, memory controller 251 performs thermal management for the memory stacks 210-213 of node 201; similarly, local memory controllers for each of processing nodes 202-204 illustrated in FIG. 2A perform thermal management for the memory stacks in their respective nodes. In alternative embodiments, a memory controller located on one node may additionally perform thermal management for multiple other nodes, or thermal management may be performed by a controller or other logic located outside of the system 200.

The memory controller 251 utilizes an integrated thermal model to determine the expected thermal level for the physical locations in the structure of processing node 201. In one embodiment, this thermal model may be developed as a theoretical model that is verified with experimental data. In one embodiment, the thermal model is used to manage data placement and compute dispatch to minimize a cost function consisting of at least the following dimensions: intra-stack thermal penalty, performance penalty, power penalty, and resilience and reliability.

The thermal model may include data stored within the memory dies A-D, or may alternatively be stored in other memory outside of node 201. In one embodiment where the thermal model data is stored in the PIM system, the thermal model data itself may also be subject to placement by the thermal management scheme. The thermal model correlates expected thermal levels with each of a number of locations within the structure of node 201 based on memory activity patterns (read throughput, write throughput, row buffer hit rate and other factors), logic die instructions per cycle (IPC), operating voltage supply levels, processor core frequencies, thermal dissipation capability of cooling components and surfaces, packaging, computation pattern (e.g., integer or floating-point intensive), latency, and other factors.

In the thermal model, each of these factors may be further associated with a particular location or region in the node 201. For example, an IPC value for a logic die may be associated with the physical location of the logic die, a value representing the thermal dissipation capability of a heat sink may be associated with the location of the heat sink, etc. For certain factors, the thermal model may include a value representing the factor for each of the physical locations being modeled; for example, the thermal model may include a value indicating the thermal dissipation capability for each of the modeled physical locations.

The thermal model also includes information indicating the locations of any cooling components and heat sources. For example, a cooling component, such as a heat sink 260 is positioned at the top of memory stack 211. Accordingly, the heat sink 260 increases the thermal dissipation capability of the memory stack 211, relative to a stack that does not have a heat sink. Due to the placement of the heat sink 260, memory dies nearer to the top of the stack 211 have a greater thermal dissipation capability than memory dies in the same stack 211 that are farther from the heat sink 260. For example, memory die 211A has a greater thermal dissipation capability than memory die 211B.

In some embodiments, heat sinks, fans, or other cooling components may also be attached to the other components of the processing node 201. For example, each of the memory stacks 210-213 may have their own respective heat sinks that are represented in the thermal model. The processor 250 may also have a heat sink that is represented in the thermal model.

In addition to heat sinks, fans, and other such cooling components, exposed surfaces of the memory stack where heat may dissipate more readily may also be modeled as cooling components. In particular, locations near exposed surfaces of a memory stack, such as the edges or top of the stack, may be modeled as having a greater thermal dissipation capability than locations farther away from exposed surfaces of the memory stack.

The thermal model also includes locations of heat sources that may increase the thermal levels at the locations in the memory stacks. In particular, locations in the processing node 201 that are closer to a heat source may have a lower thermal dissipation capability as compared to locations that are farther away from the heat source.

Thus, the expected thermal level at a particular location of the PIM system 200 (i.e., processing node 201) can be primarily determined based on the ambient temperature, power density, proximity to heat sources, distance from cooling components, and the thermal conductivity and thermal capacitance of the materials. The thermal model accounts for at least these factors, allowing the expected thermal level for multiple locations in the system 200 to be determined.

For a particular location in the node 201, power consumption and the corresponding increase in thermal level resulting from power consumption may be considered as having a static component and a dynamic component. The static component of the power consumption represents a level of power consumption that remains constant for a relatively long time period. For example, keeping the processing node 201 in a powered on state may result in at least a baseline level of power consumption even when the memory is not being accessed and the logic dies are not being utilized. Thus, each of the multiple locations in the node 201 can be associated with its own static power consumption value, or associated with a static thermal level component resulting from the static power consumption.

The dynamic component of the overall power consumption changes relatively quickly as compared to the static component of the power consumption, and is affected by such factors as memory refresh rate, read throughput, write throughput row buffer hit rate, etc. For the memory stacks 210-213 in node 201, the computational density and intensity of processing tasks executed in the logic dies also contribute the dynamic component of the power consumption, depending on the thermal resistance from the processor to the memory. Thus, each of the multiple locations in the node 201 can be associated with a dynamic thermal level component that is attributable to the dynamic component of the power consumption.

The thermal level of memory can also be affected by an access pattern of the data being stored in the memory. Accordingly, the thermal model can correlate an access pattern of the stored data with the location of the stored data. In some embodiments, compile-time analysis and/or dynamic profiling may be used to predict an access pattern for the data. The access pattern information may include, for example, an access frequency for data stored at a particular location. A higher access frequency for data stored at a given location results in a higher expected thermal level at that location than a lower access frequency for the same data stored at the same location.

In one embodiment, the PIM system 200 may also include one or more thermal sensors for sensing temperatures at one or more of the physical locations in the PIM system 200. As illustrated in FIG. 2B, the thermal sensors 220, 221, 222, and 223, are attached to the respective memory stacks 210, 211, 212, and 213 of node 201 in the PIM system 200. These sensors 220-223 measure the actual temperatures of the memory stacks 210-213. The measured temperatures can then be applied to the calibrated thermal model to more accurately predict the expected thermal levels for each of the locations in the node 201. The memory controller 251 determines the expected thermal levels for each of multiple physical locations in the node 201, including target locations for placement of memory and processing operations, based on the temperatures sensed by the sensors 220-223.

Figure 3:
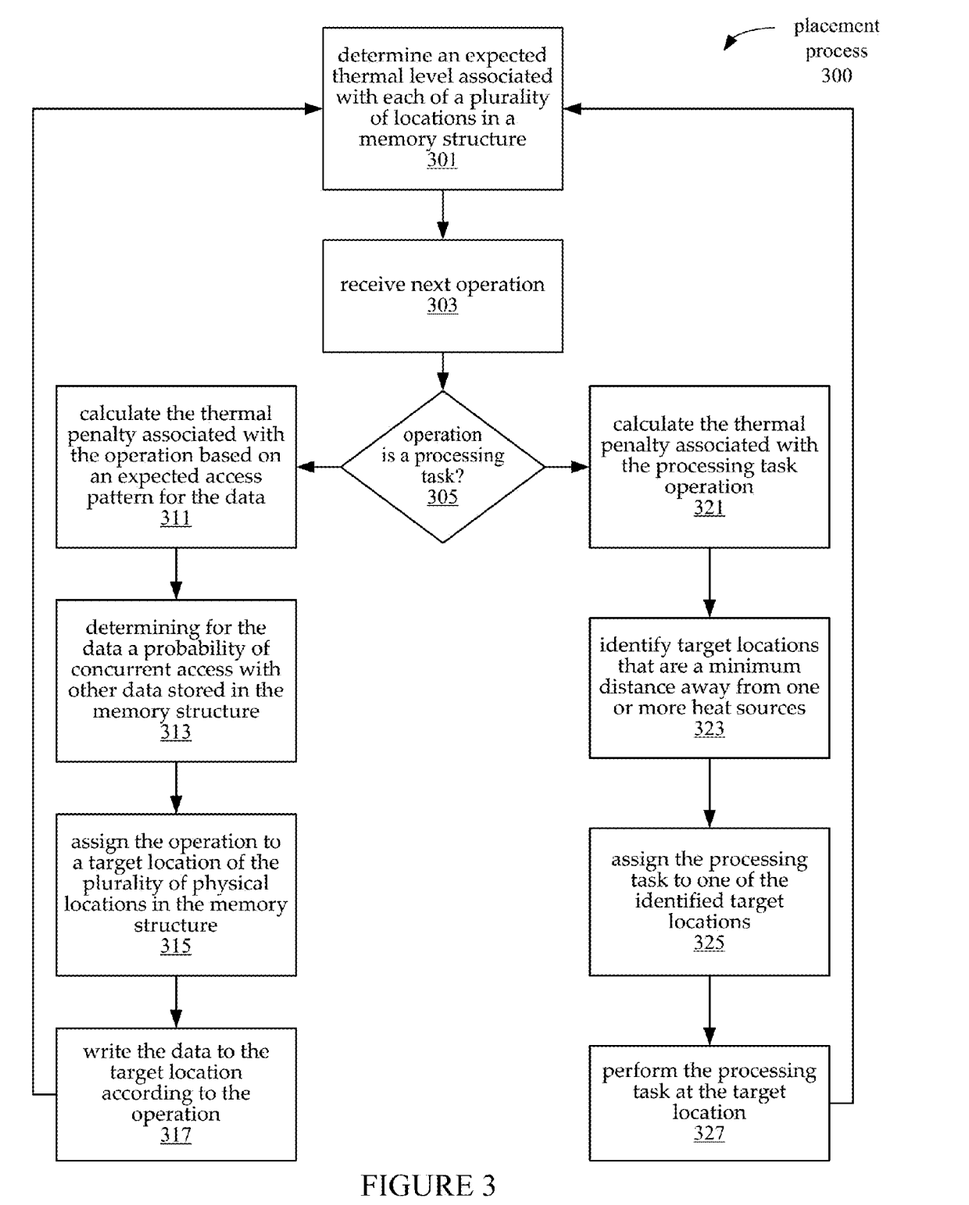
FIG. 3 is a flow diagram illustrating a thermal memory management process, according to one embodiment.

FIG. 3 illustrates a placement process 300 for placing operations in a processing node 201 of PIM system 200. In one embodiment, the operations of process 300 are performed by a control logic such as memory controller 251. Alternatively, the operations of process 300 may be performed by one or more logic dies, such as logic dies E in one or more of the memory stacks 210-213, or may be performed by a host processor 250 of the node 201 or other processing logic outside of the PIM system 200.

Process 300 begins at block 301. At block 301, the memory controller 251 determines an expected thermal level associated with each of a number of locations in the node 201. Block 301 includes the measurement of temperatures at various locations in the memory structure using thermal sensors, such as sensors 220-223. The memory controller 251 then determines the thermal level for each of the physical locations in the memory structure based on the measured temperatures and the thermal model for the node 201.

At block 303, the memory controller 251 receives an operation to be placed in the processing node 201. The received operation may be one of several queued operations that are pending placement in the node 201. At block 305, the memory controller 251 determines the type of operation that was received at block 303. For an embodiment implementing process 300, the operation can be a processing task or a memory write operation. Thus, at block 305, the memory controller 251 determines the type of the received operation. At block 305, if the operation is not a processing task, then the operation is a memory write operation and the process 300 continues accordingly at block 311. Alternative embodiments may include more than two types of operations; such embodiments may similarly determine the type of operation and perform placement of the operation using a different sequence of actions for each type.

The process 300 arrives at block 311 when the operation to be placed is a memory write operation for storing data in the memory of node 201. At block 311, the memory controller 251 calculates the thermal penalty associated with the memory write operation. The thermal penalty may be calculated based on an expected access pattern for the data being written. For example, the expected access pattern may be determined based on the expected access frequency of the data, which may in turn be determined by compile-time analysis, by monitoring a running application, or by other methods.

In one embodiment, the thermal penalty associated with a memory write operation may be affected by different types of memory accesses. For some memory technologies, a write operation consumes more power than a read operation, resulting in more heat generation. Accordingly, the calculation of a thermal penalty for an operation may account for the frequency at which the data is written, the frequency at which the data is read, the frequency of other operations that can be performed on the data, or a combination of these factors. As a more specific example, a memory access pattern for data that has a greater proportion of write accesses than read accesses can result in a greater thermal penalty for the data relative to an access pattern with a smaller proportion of write accesses.

At block 313, the memory controller 251 additionally determines for the data being placed a probability of concurrent access with other data stored in the memory. For example, compile-time or run-time analysis may reveal that two variables are typically accessed by the same function or at the same time, such that the memory locations where those variables are stored simultaneously increase in temperature due to the memory accesses. The thermal penalty of the data to be placed may thus be increased by the proximity of data that is concurrently accessed.

Accordingly, if the data for a first variable and a second variable have a relatively high probability of being accessed concurrently, the memory controller 251 can place the data for these variables together at a physical location having a greater thermal dissipation capability, or place the variables in locations that are separated by a minimum distance to balance the thermal load. In addition to the access frequency and the probability of concurrent access with other data, the thermal penalty associated with the data to be placed may also depend on operational characteristics of the memory (e.g., operating voltage, type of memory, etc.) or other factors.

At block 315, the memory controller 251 selects a target location out of the multiple available physical locations, then assigns the memory write operation to the target location. The memory controller 251 selects the target location based on the expected thermal level of the target location and based on the thermal penalty of the memory write operation, and selects a target location that will minimize uneven heating in the node 201.

For a memory write operation for which the data is associated with a relatively high thermal penalty, the memory controller 251 may store the data at a physical location having a greater thermal dissipation capability. Thus, data associated with a high thermal penalty may be stored at locations closer to cooling components or closer to exposed surfaces of the memory stacks 210-213, as compared to data with a lower thermal penalty. Since a higher access frequency for data results in a correspondingly higher thermal penalty for that data, data that is accessed frequently can be stored at a location that is closer to cooling components and exterior surfaces than data that is less frequently accessed.

For example, the memory controller 251 may store a first variable that is frequently accessed in memory die 211A while storing a second variable that is less frequently accessed than the first variable in memory die 211D. Die 211A is close to the heat sink 260, so that any excess heat generated from the frequent accesses of the first variable can be readily dissipated. The infrequently accessed second variable is placed in die 211D, which is farther from the heat sink and has a lower thermal dissipation capability than die 211A. Additionally, die 211D may absorb some thermal energy from a nearby heat source, such as the adjacent logic die 211E; die 211D stores data having a lower thermal penalty and can more easily maintain a lower thermal level.

Frequently accessed data or data associated with a relatively high thermal penalty may also be placed a minimum distance away from other types of heat sources, such as other data that is associated with a high thermal penalty. Continuing the previous example, the first variable may be assigned to a target location that is a minimum distance away from a frequently accessed third variable that also has a relatively high thermal penalty (i.e., higher than the thermal penalty of the second variable). For example, if the third variable is stored at a location on the left side of memory die 211B, the target location of the first variable may be selected as the right side of memory die 211A so that the location of the first variable is farther from the location of the third variable. In one embodiment, minimum distances between two locations may be defined in terms of an amount of space between the two locations; alternatively, a minimum distance between the two locations may mean that the two locations are in a different node, different memory stack, different die, or a different region within each die. The minimum distance can alternatively be defined by a minimum number of regions, dies, stacks, or nodes in between the two locations.

At block 315, the selection of the target location for the operation is also determined based on the probability of concurrent access with other data stored in the memory structure, as determined at block 313. In general, the target location is selected so that concurrently accessed data is stored in different locations that are not in close proximity.

In one embodiment, the memory controller 251 selects a target location by selecting a desired distance between the data to be placed and the other data based on the probability of concurrent access. For data that has a high probability of concurrent access with other data stored in the memory, the memory controller 251 may select a greater distance between the location of the other data and the target location for the data to be placed.

For example, a first variable and a second variable that are expected to be accessed concurrently may be stored in different memory stacks. Therefore, heat generated from accessing the first variable is not accumulated in the same location as heat that is simultaneously generated from accessing the second variable. The concurrently accessed data may be stored in different locations within a memory die, different memory dies, different memory stacks, different nodes, etc.

For data that has a low probability of concurrent access with other data stored in the memory, the memory controller 251 may select a shorter distance between the location of the other data and the target location for the data to be placed. In other words, data that is known or expected not to be accessed concurrently (i.e., that has a low probability of concurrent access with other data) can be placed in close proximity with the other data. For example, a first variable having a low probability of concurrent access with a second variable, the first variable and second variables can be stored near each other. Since the first and second variables are not likely to be accessed concurrently, the heat generated from the accesses is also likely to be generated at different times. For example, a first variable and a second variable having a low probability of being accessed concurrently can be placed on the same memory die or on adjacent memory dies.

At block 317, the memory controller 251 causes the data to be written to the assigned target location as provided by the received operation. From block 317, the process 300 continues back to block 301. At block 301, the thermal levels for the physical locations of the node 201 may be updated with new temperature measurements taken from sensors 220-223. The updated thermal levels can then be used for the placement of subsequent operations.

Another type of operation that can be received at block 303 is a processing task for executing in a logic die of the processing node 201. At block 305, if the received operation is a processing task, the process 300 continues at block 321. At block 321, the memory controller 251 determines the thermal penalty associated with the processing task. The thermal penalty for the processing task can be calculated based on the type of processing task; for example, a look-up table may be used to correlate different types of processing tasks with a typical thermal penalty for each of the types. The thermal penalty for the processing task may also be determined based on operating characteristics of the logic die, such as IPS, clock frequency, operating voltage, etc. A higher IPS value, higher clock frequency, or higher operating voltage results in a higher thermal penalty.

At block 323, the memory controller 251 identifies one or more available target locations that are a minimum distance away from one or more heat sources in the node 201 where the processing task can be executed. These heat sources may be any type of heat generating component in or near the node 201. Concurrently accessed data and parallel computations may also be modeled as heat sources. Compile-time analysis and/or dynamic profiling may be used to determine which sets of data are accessed concurrently and which computations occur in parallel with the processing task being placed.

Concurrently accessed data is data that is stored in the memory that is expected to be accessed concurrently with the execution of the processing task. Data that is accessed concurrently with the execution of the processing task generates heat at the same time as the processing task. Accordingly, the memory controller 251 selects a target location for the processing task that is a minimum distance away from the location of the concurrently accessed data to avoid the generation of excess heat at one location. For example, if the memory die 210D stores data that will be accessed by a processing task, the memory controller 251 may select as a target location any of the logic dies 211E, 212E, and 213E that are not in the same memory stack 210 as the die 210D.

Parallel computations are computations that are expected to occur in the processing logic, such as in logic dies E or processor 250 of the node 201, at the same time as the processing task being placed. Computations that are executed in parallel with the processing task being placed generate heat at the same time as heat is generated by the processing task. Accordingly, the memory controller 251 selects a target location for the processing task that is a minimum distance away from the logic die or processor where the parallel computation is being executed to avoid the generation of excess heat at one location. For example, if a parallel computation is being executed in logic die 210E, the memory controller 251 may select as a target location any of the other logic dies 211E, 212E, and 213E in which the parallel computation is not being executed.

In one embodiment, an iterative solution for placing computations and data begins with a preliminary data placement. Based on the preliminary data placement, computations can be placed in different physical locations in the PIM system to effect a balanced thermal load according to the principles described above. The data placement can then be revised to enable this distribution of computations. Multiple iterations may be performed until a sufficiently optimal placement solution is reached.

At block 325, the memory controller 251 assigns the processing task to one of the identified target location of block 323. The memory controller 251 may have identified a subset of the locations in the node 201 as potential target locations; thus, at block 325, the controller 251 assigns one of the potential target locations to the processing task. For example, from the available logic dies in the node 201, the memory controller 251 may have identified logic dies 222E and 223E at block 323 as suitable for executing the processing task that is being dispatched. The dies 222E and 223E may be substantially equally suitable from a thermal management perspective; thus, at block 325, the memory controller 251 selects one of the logic dies 222E and 223E to assign to the processing task. The selection may be random, or may be based on other criteria not related to thermal management of the system. At block 327, the processing task is dispatched to and executed at the assigned location. From block 327, the process 300 continues back to block 301.

At block 301, the thermal levels for the physical locations of the node 201 may be updated with new temperature measurements taken from sensors 220-223. The updated thermal levels can then be used for the placement of subsequent operations. In this manner, the process 300 minimizes thermal balances in the node 201 by placing multiple operations, including memory writes and processing tasks, at the appropriate physical locations in the node 201 based on the thermal penalties for the operations and the expected thermal levels for the target locations.

While the process 300 is described above as being applied to a single processing node 201, the process 300 can in other embodiments be used to place operations in different physical locations within a single memory stack or across multiple nodes of a memory system, such as PIM system 200. As illustrated in FIG. 2B, the memory stacks 210-213 each have four memory dies A-D and one logic die E; in alternative embodiments, a memory stack may include fewer or more memory dies and/or logic dies. An intra-stack thermal management process balances thermal levels over the memory stack by placing operations at appropriate target locations selected from multiple physical locations within the same stack. Each of these locations may represent, for example, one of the five dies in the stack, or a smaller region within one of the dies.

An intra-node thermal management process 300, as described above, balances thermal levels over the processing node 201 by placing operations at appropriate target locations selected from multiple physical locations within the same node 201. A physical location in the node 201 may correspond to, for example, the host processor 250, one of the four memory stacks, one of the 20 dies, or a smaller region within one of the dies. Processing node 201 is illustrated as having four memory stacks 210-213 and one host processor 250; however, alternative embodiments of processing nodes may include a different number of memory stacks and/or processors, may not include a host processor, or may include a non-symmetrical or non-uniform memory stack and logic die layout.

An inter-node thermal management process balances thermal levels over a PIM system 200 that includes multiple nodes 201-204 by placing operations at appropriate target locations selected from multiple physical locations within the same system 200. A physical location in the PIM system 200 may correspond to, for example, one of the four processing nodes 201-204, one of the four host processors, one the sixteen memory stacks, one of the 80 dies, or a smaller region within one of the 80 dies.

In one embodiment, the placement of data may also be based on reliability and error tolerance considerations in addition to thermal considerations. In some applications, the placement of data and computations associated with the data can affect system resilience and reliability. In particular, excess heat can degrade data reliability. In one embodiment, the memory controller 251 accordingly places critical data in cold zones, which include physical locations having an expected thermal level that is lower than a threshold thermal level. The threshold thermal level may be, for example, the average thermal level for all physical locations in the system. Accordingly, less critical data may be placed at locations having a high expected thermal level. In one embodiment, system reliability may be enhanced by actively migrating already placed data and computations to different locations in the same memory stack, in different memory stacks, or in different nodes.

The embodiments described herein may include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a non-transitory computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The non-transitory computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the memory controller 251 and/or portions thereof carried on the computer-readable storage medium may be a database or other data structure which can be read by a program and used, directly or indirectly, to fabricate the hardware comprising the controller 251. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the controller 251. The netlist may then be placed and routed to produce a data set describing geometric shapes to be applied to masks. The masks may then be used in various semiconductor fabrication steps to produce a semiconductor circuit or circuits corresponding to the controller 251. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader spirit and scope of the embodiments as set forth in the appended claims. The specification and drawings are, accordingly, to be regarded in an illustrative sense rather than a restrictive sense.

What is claimed is:

1. A method, comprising:
    determining an expected thermal level associated with each of a plurality of locations in a memory structure; and
    for each operation of a plurality of operations addressed to the memory structure,
        determining whether the operation is a processing task or a memory operation, wherein the processing task includes a computation to be performed in a logic die in the memory structure; and
        when the operation is a processing task, assigning the operation to a target location of the plurality of physical locations in the memory structure based on a thermal penalty associated with processing task, and
        the expected thermal level associated with the target location, wherein the thermal penalty associated with the processing task is a thermal penalty for executing the processing task.

2. The method of claim 1, wherein a second operation of the plurality of operations comprises a memory write operation for storing first data in the memory structure, and wherein the method further comprises:
    calculating a second thermal penalty associated with the second operation based on an expected access pattern for the first data; and
    writing the first data to a second target location based on the second thermal penalty.

3. The method of claim 2, wherein the expected access pattern for the first data comprises an expected access frequency.

4. The method of claim 3, further comprising storing the first data at a location that is closer to a cooling component in the memory structure than second data having a lower expected access frequency than the first data.

5. The method of claim 3, further comprising storing the first data at a location that is farther from a heat source in the memory structure than second data having a lower expected access frequency than the first data.

6. The method of claim 5, wherein the heat source comprises third data stored in the memory structure and having a higher expected access frequency than the second data.

7. The method of claim 5, wherein the heat source comprises a logic die in a memory stack of the memory structure.

8. The method of claim 2, further comprising determining for the first data a probability of concurrent access with second data stored in the memory structure, wherein assigning the operation to the target location further comprises selecting a distance between the target location and the location of the second data in the memory structure based on the determined probability of concurrent access.

9. The method of claim 1, further comprising assigning the first operation to a second target location that is a minimum distance away from a second memory location storing data to be accessed during execution of the processing task.

10. The method of claim 1, further comprising assigning the first operation to a first target location that is a minimum distance away from another logic die assigned to another processing task to be executed concurrently with the processing task.

11. An apparatus, comprising:
    a memory structure; and
    control logic coupled with the memory structure, wherein the control logic is configured to:
        determine an expected thermal level associated with each of a plurality of locations in the memory structure; and
        for each operation of a plurality of operations addressed to the memory structure,
            determine whether the operation is a processing task or a memory operation, wherein the processing task includes a computation to be performed in a logic die in the memory structure; and
            when the operation is a processing task, assign the operation to a target location of the plurality of physical locations in the memory structure based on a thermal penalty associated with processing task, and
            the expected thermal level associated with the target location, wherein the thermal penalty associated with the processing task is a thermal penalty for executing the processing task.

12. The apparatus of claim 11, wherein the memory structure comprises a plurality of memory stacks, each memory stack further comprising a plurality of memory dies stacked above one of a plurality of logic dies, wherein at least one operation of the plurality of operations is a memory write operation.

13. The apparatus of claim 11, further comprising a thermal model of the memory structure, wherein the thermal model comprises thermal dissipation capability information for each of the plurality of physical locations.

14. The apparatus of claim 13, wherein the thermal model further comprises an access pattern of data stored in the memory structure.

15. The apparatus of claim 11, further comprising a thermal model of the memory structure based on one or more cooling component locations and one or more heat source locations, and wherein the control logic is further configured to determine the expected thermal level associated with the target location based on the thermal model.

16. The apparatus of claim 11, further comprising one or more thermal sensors configured to sense temperatures at one or more of the physical locations in the memory structure, wherein the control logic is configured to determine the expected thermal level associated with the target location based on the sensed temperatures.

17. A non-transitory computer-readable storage medium storing instructions that, when executed by a processor, cause the processor to perform a method comprising:
   determining an expected thermal level associated with each of plurality of locations in a memory structure; and
   for each operation of a plurality of operations addressed to the memory structure,
      determining whether the operation is a processing task or a memory operation, wherein the processing task includes a computation to be performed in a logic die in the memory structure; and
      when the operation is a processing task, assigning the operation to a target location of the plurality of physical locations in the memory structure based on a thermal penalty associated with processing task, and
      the expected thermal level associated with the target location, wherein the thermal penalty associated with the processing task is a thermal penalty for executing the processing task.

18. The non-transitory computer-readable storage medium of claim 17, wherein a second operation of the plurality of operations comprises a memory write operation for storing data in the memory structure, and wherein the method further comprises:
   calculating a second thermal penalty associated with the second operation based on an expected access pattern for the data; and
   writing the data to a second target location.

19. The non-transitory computer-readable storage medium of claim 17, wherein the method further comprises assigning the first operation to the target location that is a minimum distance away from a memory location storing data to be accessed during execution of the processing task.

20. The method of claim 1, further comprising executing the processing task in the logic die, wherein the thermal penalty for executing the processing task corresponds to an amount of heat generated by the logic die from executing the processing task.

* * * * *